United States Patent
Tanibuchi et al.

(10) Patent No.: US 8,449,992 B2
(45) Date of Patent: May 28, 2013

(54) SURFACE-COATED MEMBER AND CUTTING TOOL

(75) Inventors: Takahito Tanibuchi, Kagoshima (JP);
Yoshikazu Kodama, Kagoshima (JP);
Tsuyoshi Fukano, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 295 days.

(21) Appl. No.: 12/919,740

(22) PCT Filed: Feb. 25, 2009

(86) PCT No.: PCT/JP2009/053389
§ 371 (c)(1),
(2), (4) Date: Aug. 26, 2010

(87) PCT Pub. No.: WO2009/107648
PCT Pub. Date: Sep. 3, 2009

(65) Prior Publication Data
US 2010/0330360 A1    Dec. 30, 2010

(30) Foreign Application Priority Data

Feb. 27, 2008 (JP) .................. 2008-045559
Mar. 27, 2008 (JP) .................. 2008-083955
Apr. 24, 2008 (JP) .................. 2008-113490

(51) Int. Cl.
*B32B 9/00*    (2006.01)

(52) U.S. Cl.
USPC .............. 428/697; 51/307; 51/309; 428/698; 428/699; 428/701; 428/702

(58) Field of Classification Search
USPC .................... 51/307, 309; 428/697, 698, 699, 428/701, 702
See application file for complete search history.

(56) References Cited

U.S. PATENT DOCUMENTS

| | | | | |
|---|---|---|---|---|
| 5,487,625 | A * | 1/1996 | Ljungberg et al. | 51/307 |
| 6,093,479 | A * | 7/2000 | Yoshimura et al. | 428/697 |
| 7,135,221 | B2 * | 11/2006 | Ruppi et al. | 51/309 |
| 7,163,735 | B2 * | 1/2007 | Ruppi | 428/701 |
| 7,442,431 | B2 * | 10/2008 | Ruppi | 428/699 |
| 7,455,900 | B2 * | 11/2008 | Ruppi | 428/701 |
| 7,455,918 | B2 * | 11/2008 | Gates et al. | 428/702 |

FOREIGN PATENT DOCUMENTS

| | | | |
|---|---|---|---|
| JP | 63-089202 | * | 4/1988 |
| JP | 6-316758 | | 11/1994 |
| JP | 7-108405 | | 4/1995 |
| JP | 10-237649 | * | 9/1998 |

(Continued)

OTHER PUBLICATIONS

International Search Report issued in PCT/JP2009053389, on Jun. 2, 2009, 6 pages.

*Primary Examiner* — Archene Turner
(74) *Attorney, Agent, or Firm* — Procopio, Cory, Hargreaves & Savitch LLP

(57) ABSTRACT

Disclosed is a surface coated member having excellent adhesion resistance and fracture resistance. A surface coated member (1) comprises a coating layer (3) on the surface of a base (2). The coating layer (3) is composed of a multilayer body wherein a titanium carbonitride (TiCN) layer (4), a continuously existing intermediate layer (5) containing titanium, aluminum, carbon and oxygen and having an average film thickness of 5-30 nm, and an α-aluminum oxide ($Al_2O_3$) layer (9) composed of aluminum oxide ($Al_2O_3$) having an α crystal structure are sequentially formed by deposition.

12 Claims, 8 Drawing Sheets

1.0μm

FOREIGN PATENT DOCUMENTS

| | | |
|---|---|---|
| JP | 11-77407 | 3/1999 |
| JP | 2003-25114 | 1/2003 |
| JP | 2004-124246 | 4/2004 |
| JP | 2006-55950 | 3/2006 |

* cited by examiner 1.0μm

SURFACE-COATED MEMBER AND CUTTING TOOL

TECHNICAL FIELD

The present invention relates to a surface-coated member obtained by forming a coating layer on the surface of a substrate and a cutting tool using the member.

BACKGROUND ART

Conventionally, a surface-coated cutting tool comprising a monolayer or multilayer coating layer on the surface of a substrate of a cemented carbide, a cermet, a ceramic, or the like has been known as a cutting tool to be used widely in cutting processing of metals, printed circuit boards, etc. As the coating layer, those composed by layering a titanium carbide (TiC) layer, a titanium nitride (TiN) layer, a titanium carbonitride (TiCN) layer, an aluminum oxide ($Al_2O_3$) layer, and so on have been often used.

Having a good oxidation resistance, the $Al_2O_3$ layer among these coating layers exhibits high abrasion resistance and high capability in the processing condition in which the temperature of a cutting edge tends to be high temperature at the time of cutting, e.g., even in processing condition for processing of materials such as cast iron and alloyed steel which are hard to be cut or for high speed cutting. Especially, an $Al_2O_3$ layer made of $Al_2O_3$ with α-type crystal structure (hereinafter, referred to as α-type $Al_2O_3$ layer for short) has been conventionally used in a wide range since it has high hardness and high oxidation resistance.

For example, Patent Document 1 discloses a surface-coated cutting tool having an $Al_2O_3$ layer of $Al_2O_3$ having orientation with values of I(030)/I(104) and I(012)/I(030) greater than 1, respectively, where the peak intensity of a (hkl) plane of $Al_2O_3$ of mainly α-type crystal by x-ray diffraction analysis is defined as I(hkl) and describes that the fracture resistance of the $Al_2O_3$ layer can be improved.

Further, Patent Document 2 discloses a coated article with an texture coefficient of the (012) plane of α-type $Al_2O_3$ layer (TC: the index expressing the maximum peak intensity of diffraction peaks attributed to the (012) plane among the entire diffraction peaks of the α-type $Al_2O_3$ crystal) higher than 1.3 and describes that the particles of the $Al_2O_3$ layer can be made fine and the hardness and strength of the $Al_2O_3$ layer can be improved.

On the other hand, Patent Document 3 discloses a coated tool having an $Al_2O_3$ layer of $Al_2O_3$ with κ-type crystal structure and the surface separation of 1.43 Å (namely, diffraction angle 2θ is 65.18°) of the highest intense peak with the highest x-ray diffraction intensity and describes that the adhesion of the $Al_2O_3$ layer can be improved.

Patent Document 1: Japanese Patent Laid Open Publication No. H07-108405
Patent Document 2: Japanese Patent Laid Open Publication No. H06-316758
Patent Document 3: Japanese Patent Laid Open Publication No. H11-77407

DISCLOSURE OF THE INVENTION

Problems to be Solved by the Invention

However, along with today's high efficiency of the cutting processing, a cutting tool tends to be used in further severe cutting conditions. In such severe cutting conditions, with respect to the α-type $Al_2O_3$ layer in Patent Document 1 and Patent Document 2 in which the oriental direction of the entire crystal with the peak intensity of the diffraction peak is merely controlled, the $Al_2O_3$ layer is insufficient in the adhesion and thus cannot withstand the severe cutting conditions to sometimes cause separation in the boundary between the $Al_2O_3$ layer and a layer beneath.

Further, as described in Patent Document 3, if the $Al_2O_3$ layer is made to have the κ-type crystal structure, the adhesion to the layer beneath can be reinforced; however $Al_2O_3$ with the κ-type crystal structure has lower hardness than $Al_2O_3$ with α-type crystal structure and therefore, there is a problem that progression of abrasion is rapid.

Accordingly, the present invention has been made in view of the above-mentioned problems and an object of the invention is to provide a surface-coated member having a coating layer with high adhesion and high wear resistance.

Means for Solving the Problems

A surface-coated member of the present invention is provided with a coating layer having a layered body formed by successively bonding a titanium carbonitride (TiCN) layer, an interlayer containing titanium, aluminum, carbon, and oxygen, having an average thickness of 0.5 to 30 nm, and existing without disconnection, and an aluminum oxide ($Al_2O_3$) layer including an aluminum oxide ($Al_2O_3$) with the α-type crystal structure on the surface of a substrate.

Herein, in the above-mentioned configuration, that the oxygen content in the center of the interlayer in the thickness direction is 15 to 40% by atom is preferable since almost entirely the $Al_2O_3$ crystal with the α-type crystal structure is stably produced without partial production of $Al_2O_3$ crystal with κ-type crystal structure in the aluminum oxide ($Al_2O_3$) layer.

Further, in the above-mentioned configuration, with respect to the diffraction peaks of x-ray diffraction analysis for the surface-coated member, it is found that in the case where $θ_t$ is defined as the 2θ value of a diffraction peak attributed to the (200) plane of TiCN; $θ_{t0}$ is defined as the 2θ value of a diffraction peak attributed to the (200) plane of TiCN described in JCPDS card; $θ_{a(hkl)}$ is defined as the 2θ value of a diffraction peak attributed to the (012), (104), (110), and (113) planes of the α-type crystal structure of $Al_2O_3$ (wherein, (hkl) is one of (012), (104), (110), and (113)); and $θ_{a0(hkl)}$ is defined as the 2θ value of a diffraction peak attributed to the (012), (104), (110), and (113) planes of the α-type crystal structure of $Al_2O_3$ described in JCPDS card (wherein, (hkl) is one of (012), (104), (110), and (113)); an effect of suppressing the crystal strain and preventing peeling between the titanium carbonitride (TiCN) layer and the α-type $Al_2O_3$ layer is caused by controlling the difference of $Δθ_{z(hkl)}(=θ_t-θ_{a(hkl)})$ (wherein (hkl) is one of (012), (104), (110), and (113)) between the difference $Δθ_t(=θ_t-θ_{t0})$ of $θ_t$ and $θ_{t0}$ and the difference of $Δθ_{a(hkl)}(=θ_{a(hkl)}-θ_{a0(hkl)})$ of $θ_{a(hkl)}$ and $θ_{a0(hkl)}$ of (012), (104), (110), and (113) planes in a range of −0.2° to 0.2° for all cases.

Furthermore, in the case where $Δθ_{z(012)}$ for the (012) plane is in a range of −0.2° to 0.2°, the adhesion between the titanium carbonitride layer and the α-type aluminum oxide layer is further improved.

Herein, with respect to the α-type aluminum oxide layer, in the case where the difference of the $θ_{a(12)}$ and the $θ_{a0(12)}$ is corrected to be zero, $θ_{a(116)}$ appears at a lower angle than $θ_{a0(116)}$ and it is preferable since the α-type aluminum oxide crystal is strained in a specified direction to optimize the distribution of the residual stress and the hardness and strength of the aluminum oxide layer can be improved and both of the abrasion resistance and the fracture resistance of the α-type aluminum oxide layer can be improved.

In this case, appearance of the $\theta_{a(116)}$ in the higher angle side by 31.8° to 31.9° than the $\theta_{a(012)}$ is preferable since the residual stress applied to the α-type aluminum oxide crystal can be optimized and decrease of the fracture resistance of the α-type aluminum oxide layer due to excess increase of the residual stress can be prevented.

Further, appearance of $\theta_{a(104)}$, $\theta_{a(110)}$, $\theta_{a(113)}$, and $\theta_{a(024)}$ in the higher angle side of $\theta_{a0(104)}$, $\theta_{a0(110)}$, $\theta_{a0(113)}$, and $\theta_{a0(024)}$ is preferable since the strength of aluminum oxide particles can be improved and the fracture resistance of the α-type aluminum oxide layer can be improved.

Moreover, a surface-coated cutting tool of the present invention is provided with the aforementioned surface-coated member. With such a configuration, a cutting tool is good in the wear resistance and fracture resistance and has a long tool life can be provided.

BEST MODE FOR CARRYING OUT THE INVENTION

The surface-coated member of the present invention comprises the interlayer containing titanium, aluminum, carbon, and oxygen and existing without disconnection, so that the aluminum oxide layer on the upper part of the interlayer is to be an almost all α-type $Al_2O_3$ layer and also the average thickness of the interlayer is as thin as 0.5 to 30 nm, and therefore, peeling of the aluminum oxide layer from the interlayer part due to oxygen content can be suppressed.

PREFERRED MODES OF EMBODIMENTS OF THE INVENTION

FIG. 1 shows an image of a cross section of a surface-coated member 1 including a coating layer 3 by a transmission electron microscopic (TEM) photograph. FIG. 2 shows scanning electron microscope (SEM) photographs of the peripheries of the interlayers of cross sections of coating layers 3 and FIG. 2(a) shows a member of the invention and FIG. 2(b) shows a member for comparison. FIG. 3 shows an image of a main part of a cross-section of the coating layer 3 by a field emission-transmission electron microscopic (FE-TEM) photograph.

A surface-coated member 1 according to one embodiment of the invention is, as shown in FIGS. 1 to 3, provided with a substrate 2 and a coating layer 3 formed on the surface of the substrate 2. The coating layer 3 is formed by successively bonding a titanium carbonitride (TiCN) layer 4, an interlayer 5 containing titanium, aluminum, oxygen, and carbon, and an aluminum oxide ($Al_2O_3$) layer 9 including an aluminum oxide ($Al_2O_3$) crystal that is mainly the α-type crystal structure.

Herein, the interlayer 5 has an average thickness of 0.5 to 30 nm and exists without disconnection. Attributed to that, the α-type $Al_2O_3$ layer 9 on the interlayer 5 is formed substantially of a single α-type $Al_2O_3$ and moreover the interlayer 5 is thin, and therefore, even when oxygen with low hardness is contained, peeling from the interlayer 5 can be suppressed.

In other words, if the interlayer 5 containing titanium, aluminum, oxygen, and carbon does not exist, the existence ratio of $Al_2O_3$ with the α-type crystal structure is decreased because of production of $Al_2O_3$ with the κ-type crystal structure in the α-type $Al_2O_3$ layer 9 thereon and therefore hardness of the $Al_2O_3$ layer is decreased. Further, if the average thickness of the interlayer 5 is smaller than 0.5 nm, it is difficult to form the interlayer 5 without disconnection and when the interlayer 5 is disconnected, the $Al_2O_3$ with the κ-type crystal structure is formed in the α-type $Al_2O_3$ layer 9 at the disconnected point. Furthermore, if the thickness of the interlayer 5 is larger than 30 nm, the interlayer 5 containing oxygen and having low hardness tends to be peeled easily due to the effect of the stress generated between the TiCN layer 4 and the α-type $Al_2O_3$ layer 9.

The thickness of the interlayer 5 can be measured by observation of a transmission electron microscopic (TEM) photograph of a cross section of the surface-coated member 1 including the coating layer 3. The atom types composing the interlayer 5 and the composition ratio can be measured by existence determination and quantitative analysis of elements with Energy Dispersive spectroscopy (EDS) and electron energy-loss spectroscopy (EELS) by using the transmission electron microscope (TEM).

The content of oxygen in the center of the interlayer 5 in the thickness direction is 15 to 40% by atom is preferable since $Al_2O_3$ with almost entirely α-type crystal structure can be stably produced without partial production of $Al_2O_3$ crystal with κ-type crystal structure in the aluminum oxide ($Al_2O_3$) layer 9.

Further, with respect to diffraction peaks of the hard layer 3 obtained by X-ray diffraction analysis, $\theta_t$ is defined as the 2θ value of a diffraction peak attributed to the (200) plane of TiCN; $\theta_{t0}$ is defined as the 2θ value of a diffraction peak attributed to the (200) plane described in JCPDS card (Powder x-ray diffraction data file of chemical substances published by Joint Committee on Powder Diffraction Standards); $\theta_{a(hkl)}$ is defined as the 2θ value of a diffraction peak attributed to the (012), (104), (110), and (113) planes of the α-type crystal structure of $Al_2O_3$, where (hkl) is one of (012), (104), (110), and (113), respectively; and $\theta_{a0(hkl)}$ is defined as the 2θ value of a diffraction peak attributed to the (012), (104), (110), and (113) planes of the α-type crystal structure of $Al_2O_3$ described in JCPDS card where, (hkl) is one of (012), (104), (110), and (113)), respectively. If the difference of $\Delta\theta_{z(hkl)}(=\theta_t-\theta_{a(hkl)})$, where (hkl) is one of (012), (104), (110), and (113)) between the difference $\Delta\theta_t(=\theta_t-\theta_{t0})$ of $\theta_t$ and $\theta_{t0}$ and the difference of $\Delta\theta_{a(hkl)}(=\theta_{a(hkl)}-\theta_{a0(hkl)})$ of $\theta_{a(hkl)}$ and $\theta_{a0(hkl)}$ of (012), (104), (110), and (113) planes is all in a range of −0.2° to 0.2°, no peeling occurs in the interface of the TiCN layer 4 and the α-type $Al_2O_3$ layer 9 and thus the adhesion of the α-type $Al_2O_3$ layer 9 is consequently improved.

Further, it is also found that if $\Delta\theta_{z(012)}$ of the (012) plane of the α-type $Al_2O_3$ is in a range of −0.2° to 0°, the adhesion between the TiCN layer 4 and the α-type $Al_2O_3$ layer 9 can be further improved.

In addition, the x-ray diffraction measurement method of the present invention is carried out by using Cu—Kα ray generated by using Cu as a bulb for x-ray. To specify the position of the diffraction angle 2θ, Kα removal is carried out for accurate measurement of the peak position. Other measurement conditions are based on the conditions of a general x-ray diffraction method.

Herein, according to this embodiment, when the difference between $\theta_{a(112)}$ and $\theta_{a0(112)}$ is corrected to be zero for the α-type $Al_2O_3$ layer 9, $\theta_{a(116)}$ appears at a lower angle than $\theta_{a0(116)}$ (57.52°) and it is preferable since the α-type aluminum oxide crystal is strained in a specified direction to optimize the distribution of the residual stress and the hardness and strength of the $Al_2O_3$ layer 9 can be improved and both of the wear resistance and the fracture resistance of the α-type $Al_2O_3$ layer 9 can be improved.

That is, in an α-type $Al_2O_3$ layer formed by a conventional CVD method, tensile stress is caused, the α-type $Al_2O_3$ layer including the crystal structure with 2θ(116) shifted to the higher angle side than $2\theta_0(116)$, whereas in the $\alpha$-type $Al_2O_3$ layer 9 of the surface-coated member 1 according to this embodiment, the stress in the different direction from that of the stress applied to the (116) plane of the $\alpha$-$Al_2O_3$ layer formed by the conventional CVD method is applied to the (116) plane and the tensile stress is relieved, the $\alpha$-type $Al_2O_3$ layer 9 including a crystal structure with $2\theta(116)$ shifted to the lower angle side than $2\theta_0(116)$. With such a configuration, the surface-coated member 1 of this embodiment can be provided with improved strength and hardness of the $\alpha$-type $Al_2O_3$ layer 9 and improved fracture resistance and wear resistance.

In this case, appearance of $\theta_{a(116)}$ in the higher angle side by 31.8° to 31.9° than $\theta_{a(012)}$ is preferable since the state of the residual stress applied to the $\alpha$-type $Al_2O_3$ crystal can be optimized and decrease of the fracture resistance of the $\alpha$-type $Al_2O_3$ layer 9 due to excess increase of the residual stress can be prevented.

The reason why the peak of the (012) plane among the peaks of $\alpha$-type $Al_2O_3$ layer 9 is used as a reference in the case of correction of the measurement data of the respective planes because the peak is positioned at the lowest angle side. That is, it is because the peak shift is slight even if strains are generated in the lattice.

Further, appearance of $\theta_{a(104)}$, $\theta_{a(110)}$, $\theta_{a(113)}$, and $\theta_{a(024)}$ in the higher angle side of $\theta_{a0(104)}$, $\theta_{a0(110)}$, $\theta_{a0(113)}$, and $\theta_{a0(024)}$ is preferable since the strength of $Al_2O_3$ crystal can be improved and the fracture resistance of the $\alpha$-type $Al_2O_3$ layer can be improved.

The content of titanium atom in the center of the interlayer 5 in the thickness direction is preferably 20 to 40% by atom in the entire amount of all elements detected by the composition analysis and the content of aluminum atom is preferably 5 to 15% by atom since the intermediate composition between the titanium carbonitride layer 4 and the $\alpha$-type $Al_2O_3$ layer 9 can be obtained to achieve firm bonding.

Furthermore, the content of oxygen atom in the center of the interlayer 5 in the thickness direction is preferable to be 25 to 40% by atom in the entire amount of all elements detected by the composition analysis since the hardness and strength of the interlayer 5 can be improved and breakage easily caused by strong impact can be suppressed and good adhesiveness can be maintained.

The TiCN layer 4 formed immediately under the interlayer 5 may be a TiCN layer made of granular crystals or a TiCN layer made of columnar crystals; however if the TiCN layer 4 is composed of columnar crystals, the toughness of the entire coating layer 3 is increased and thus fracture and chipping of the coating layer 3 can be suppressed.

The interlayer 5 positioned in the interface between the TiCN layer 4 and the $\alpha$-type $Al_2O_3$ layer 9 can be formed by supplying only raw source gases containing both of titanium element of the TiCN layer 4 and aluminum element of the $\alpha$-type $Al_2O_3$ layer 9 and causing no chemical reaction and depositing and leaving a portion of the raw source gases on the surface of the coating layer during the coating formation (before the formation of the $\alpha$-type $Al_2O_3$ layer 9) to form an extremely thin and disconnected interlayer 5.

Further, it is preferable to form at least one layer, that is, another Ti-type coating layer, selected from a group consisting of a titanium nitride layer, a titanium carbide layer, a titanium oxycarbonitride layer, a titanium oxycarbide layer, and a titanium oxynitride layer between the TiCN layer 4 and the substrate 2, or on the $\alpha$-type $Al_2O_3$ layer 9.

The substrate 2 of the surface-coated member 1 to be used preferably may be cemented carbides obtained by bonding tungsten carbide (WC) and a hard phase of at least one kind selected from a group consisting of carbides, nitrides, and carbonitrides of Group IV, V, and VI metals of a period chart of the elements with a bonding phase containing ferrous metals such as cobalt (Co) and/or nickel (Ni); Ti-based cermets, and ceramics such as $Si_3N_4$, $Al_2O_3$, diamond, cubic boron nitride (cBN), etc. Especially, if the surface-coated member 1 is used as a cutting tool, the substrate 2 is preferable to be a cemented carbide or a cermet in terms of the fracture resistance and wear resistance. Further, as usage, the substrate 2 may be a metal such as carbon steel, a high-speed steel, an alloy steel, etc.

Moreover, the surface-coated member 1 with the above-mentioned configuration can be used for various applications such as sliding parts, wear resistant parts such as sliding parts and dies, drilling tools, knives, impact resistant parts, etc. other than cutting tools. For example, in the case of use of the member for a cutting tool, the surface-coated member 1 is used in the cutting processing state that a cutting edge formed in a crossing part of a rake face and a flank face is attached to an object to be cut, and the above-mentioned excellent effects can be caused. Furthermore, even in the case of other uses, the surface-coated member 1 has excellent mechanical reliability.

Particularly, with respect to the application for cutting tools, in a severe cutting condition that high impact is applied to the cutting edge, for example, a heavy intermittent cutting of metals in which highly hard particles are dispersed such as gray cast iron (FC material) and ductile cast iron (FCD material) as a work material, the cutting tool shows an excellent cutting property as compared with a conventional cutting tool. In other words, even if a high impact is abruptly applied to the coating layer 3, since the $\alpha$-type $Al_2O_3$ layer 9 is bonded firmly to the titanium carbonitride layer 4 through the interlayer 5 in the coating layer 3 of this embodiment, chipping or fracture of the coating layer 3 can be suppressed. Further, in continuous cutting condition that the depth of cutting is fluctuated during the cutting such as cutting of pouring gates existing in cast iron or burrs of casting dies and also in the combinated cutting condition of continuous cutting and intermittent cutting in combination, the cutting tool shows an excellent cutting property. No need to say, in the cutting process of steels, the cutting tool also shows excellent fracture resistance and wear resistance as compared with a conventional cutting tool.

(Method of Manufacturing)

One embodiment of a method for producing the above-mentioned cutting tool is described.

At first, a metal powder, a carbon powder, etc. are properly added to an inorganic powder such as metal carbides, nitrides, carbonitrides, oxides, etc. that can be formed by firing the above-mentioned substrate and the mixture is mixed and the resultant mixture is formed in a prescribed tool shape by a conventional molding method such as press-molding, casting, extrusion molding, cold isostatic pressing, etc. Thereafter, the obtained formed body is fired in vacuum or non-oxidizing atmosphere to produce the above-mentioned substrate 2 of a hard alloy. Based on the necessity, the surface of the substrate 2 is subjected to polishing processing or horning processing for edge parts.

Next, a coating layer 3 is formed by chemical vapor deposition (CVD) method on the surface of the obtained substrate 2.

At first, a titanium nitride (TiN) layer is formed as an undercoat layer 7 directly on the substrate 2 if desired. As one example of the coating (formation) condition of the titanium nitride layer as the undercoat layer 7, a gas mixture containing 0.5 to 10% by volume of titanium tetrachloride ($TiCl_4$) gas, 10 to 60% by volume of nitrogen ($N_2$) gas, and balance hydrogen ($H_2$) gas is used as a mixed gas composition and the coating formation temperature and pressure are desired to be 800 to 940° C. (in the chamber) and 8 to 50 kPa.

Next, a titanium carbonitride (TiCN) layer 4 is formed on the upper layer of the undercoating layer 7 ("a" step).

One example of coating formation condition of the TiCN layer 4 includes a condition that a gas mixture containing 0.5 to 10% by volume of titanium tetrachloride ($TiCl_4$) gas, 10 to 60% by volume of nitrogen ($N_2$) gas, 0.1 to 3.0% by volume of acetonitrile ($CH_3CN$) gas, and balance hydrogen ($H_2$) gas is used as a mixed gas composition: the coating formation temperature is 780 to 880° C. (in the chamber): and the pressure is 5 to 25 kPa and a so-called MT-TiCN layer composed of columnar crystals is formed. Accordingly, the fracture resistance of the coating layer 3 can be improved.

Further, the TiCN layer 4 is no need to have a single structure formed by a single condition for the entire layer and the coating formation condition can be changed in the middle. For example, in the middle of the coating formation in the above-mentioned condition, the coating formation condition can be changed to a condition that a gas mixture containing 0.1 to 3% by volume of titanium tetrachloride ($TiCl_4$) gas, 0.1 to 10% by volume of methane ($CH_4$) gas or acetonitrile ($CH_3CN$) gas, 0 to 15% by volume of nitrogen ($N_2$) gas, and balance hydrogen ($H_2$) gas is used: the coating formation temperature is 950 to 1100° C.: and the pressure is 5 to 40 kPa to form HT-TiCN layer composed of granular crystals. In such as manner, it is preferable to form a layered structure of the MT-TiCN layer composed of columnar crystals and HT-TiCN layer composed of granular crystals in terms of improvement of the adhesion between the TiCN layer 4 and the α-type $Al_2O_3$ layer 9.

Next, the interlayer 5 is to be formed on the upper layer of the TiCN layer 4.

At first, only titanium chloride ($TiCl_4$) is led or titanium chloride ($TiCl_4$) and a reaction gas containing an oxygen source and a carbon source are led using hydrogen as a carrier gas to form a base to be the interlayer 5 (b-1 step: titanium-conversion step). Consequently, the surface of the TiCN layer 4 is etched to be the base of the interlayer 5. At that time, the gas mixture to be used is a gas mixture containing 0.5 to 10% by volume of titanium tetrachloride ($TiCl_4$) gas and balance hydrogen ($H_2$) gas as a mixed gas composition. The gas mixture is introduced into the reaction chamber and the temperature in the chamber is set at 950 to 1100° C. and the pressure is set to at 5 to 40 kPa (titanium conversion step: b-1 step).

This step is effective to cause corrosion on the surface of the TiCN layer 4 during the process of decomposing the $TiCl_4$ gas serving as a treatment gas, and to form micro-recessions and projections in the surface of the TiCN layer 4 by the etching effect of the compound. Therefore, the adhesiveness can be further improved due to the anchor effect of the micro-recessions and projections.

Next, nitrogen ($N_2$) or a noble gas such as argon (Ar) is led by using carbon dioxide ($CO_2$) as a carrier gas to oxidize the surface of the base to be the interlayer 5 (b-2 step: oxidation treatment step). Consequently, the surface of the coating layer including the base for forming the interlayer 5 during the coating formation is oxidized to a proper but not excess extent. The condition of the gas mixture at that time is use of a gas mixture containing 0.5 to 4.0% by volume of carbon dioxide ($CO_2$) gas and balance of nitrogen ($N_2$) gas. The gas mixture is introduced into the reaction chamber and the temperature in the chamber is set at 950 to 1100° C. and the pressure is set to at 5 to 40 kPa to oxidize the surface of the TiCN layer 4 containing the base to be the interlayer 5.

In the above-mentioned condition, the b-1 step (titanium conversion step) may be omitted and the gas mixture condition for the coating formation in the next b-2 step (oxidation step) may be changed to a gas mixture containing 0.1 to 0.5% by volume of carbon dioxide ($CO_2$) gas and balance of nitrogen ($N_2$) gas and the gas mixture is introduced into the reaction chamber and the temperature in the chamber is set at 950 to 1100° C. and the pressure is set to at 5 to 40 kPa to form the interlayer 5 with a thickness as extremely thin as 0.5 to 5 nm.

Thereafter, aluminum chloride ($AlCl_3$) is led by using hydrogen as a carrier gas to carry out pretreatment (b-3 step: aluminum conversion step) for forming an $Al_2O_3$ layer described below on the surface of the interlayer oxidized in the b-2 step. Concretely one example of the coating formation condition is that a gas mixture containing 0.5 to 5.0% by volume of aluminum trichloride ($AlCl_3$) gas and balance hydrogen ($H_2$) gas is used as a mixed gas composition and the temperature and pressure are set to be 950 to 1100° C. and 5 to 40 kPa in the chamber. Additionally, the b-3 step can be replaced with the c step, which is a coating formation step of the α-type $Al_2O_3$ layer 9 described below, and therefore may be omitted; however in order to produce the nuclei of $Al_2O_3$ crystals in the α-type crystal structure which is a base for forming the α-type $Al_2O_3$ layer 9 and heighten the adhesion between the $Al_2O_3$ layer 9 and the interlayer 5, the b-3 step is better to be carried out.

As described above, the interlayer 5 is a reformed layer of the TiCN layer 4 produced by etching of the surface part of the TiCN layer 4 and successively oxidizing the layer.

Formation of the interlayer 5 by the method involving such steps makes it possible to form the interlayer 5 with an extremely thin thickness without disconnection which causes an effect on the crystal growth of the α-type $Al_2O_3$ layer 9 to be formed directly on the interlayer 5. That is, in a method for forming the interlayer 5 by a general chemical reaction by introducing raw source gases, at first, nuclei of the formed interlayer 5 are dispersedly formed and the nuclei are gradually increased and deposited and therefore, it is difficult to form the interlayer 5 with a thickness as extremely thin as 30 nm without disconnection. According to the invention, the interlayer 5 is controlled by oxidation of the surface of the coating layer during the coating formation. Herein, at the time of oxidation, hydrogen ($H_2$) to be used generally as a carrier gas for the CVD method, carbon dioxide ($CO_2$) is reacted for oxidation with hydrogen ($H_2$) to produce water ($H_2 + CO_2 = H_2O + CO$) and due to the produced water, the surface of the coating layer is reacted intensely to produce titanium oxide, which is abnormally grown and forms a coating (refer to FIG. 2B). Therefore, according to the invention, in order to suppress the oxidation of the surface of the coating layer to an excess extent in the oxidation step, nitrogen ($N_2$) or a noble gas is used instead of hydrogen ($H_2$) as the carrier gas. Accordingly, the surface of the coating layer is prevented from excess oxidation due to the reaction with carbon dioxide ($CO_2$) for oxidation and the interlayer 5 with an extremely thin thickness can be formed without disconnection (refer to FIG. 2A). In addition, in the case where carbon monoxide (CO) is used in place of carbon dioxide ($CO_2$) for oxidation, the surface of the coating layer cannot be oxidized sufficiently, and κ-type crystals tend to be formed in the α-type $Al_2O_3$ layer 9.

Thereafter, successively, the α-type $Al_2O_3$ layer 9 is formed (c step). A concrete example of the coating formation condition is desirably that a gas mixture containing 0.5 to 5.0% by volume of aluminum trichloride ($AlCl_3$) gas, 0.5 to 3.5% by volume of hydrogen chloride (HCl) gas, 0.5 to 5.0% by volume of carbon dioxide ($CO_2$) gas, 0 to 0.5% by volume of hydrogen sulfide ($H_2S$) gas and balance hydrogen ($H_2$) gas is used and the coating formation temperature and pressure are set to be 950 to 1100° C. and 5 to 10 kPa.

Herein, for the α-type $Al_2O_3$ layer 9, a lower part region of the α-type $Al_2O_3$ layer 9 is formed in the coating formation condition of a lowered flow rate of HCl gas and thereafter, an upper part region of the α-type $Al_2O_3$ layer 9 is formed in the coating formation condition that the HCl gas flow rate is increased higher than that of the former condition. That is, the α-type $Al_2O_3$ layer 9 is desired to have two kinds of regions different in the crystal structure of the α-type $Al_2O_3$ layer 9. Accordingly, the nuclei of fine crystals of α-type $Al_2O_3$ are formed in the initial period of the coating formation. Therefore, the residual stress applied on the α-type $Al_2O_3$ existing in the interface with the interlayer 5 can be dispersed to heighten the adhesion in the interface. Further, formation of the nuclei of fine crystals of the α-type $Al_2O_3$ causes an effect of making the crystals of the entire α-type $Al_2O_3$ layer 9 be fine and increasing the hardness of the α-type $Al_2O_3$ layer 9.

Furthermore, if desired, a titanium nitride layer is formed as a surface layer 10 on the upper layer of the α-type $Al_2O_3$ layer 9. The coating formation condition of the TiN layer is desired to that a gas mixture containing 0.1 to 10% by volume of titanium tetrachloride ($TiCl_4$) gas, 10 to 60% by volume of nitrogen ($N_2$) gas, and balance hydrogen ($H_2$) gas is used as a gas mixture composition and the temperature and the pressure in the reaction chamber are set to be 960 to 1100° C. and 10 to 85 kPa.

If desired, at least the cutting edge part of the surface of the coating layer 3 is subjected to polishing processing. The polishing processing makes the cutting edge part smooth and suppresses deposition of weld and gives a tool further excellent in the fracture resistance.

EXAMPLE 1

A mixture obtained by adding 6 wt. % of metal cobalt (Co) powder with an average particle diameter of 1.2 μm and 0.2 wt. % of tantalum carbide (TaC) powder were mixed with tungsten carbide (WC) powder with an average particle diameter of 1.5 μm was mixed and formed by press-forming to obtain a cutting tool shape (CNMA 120412). The molded body was subjected to de-binder treatment and fired at 1400° C. for 1 hour in vacuum of 0.5 to 100 Pa to produce a cemented carbide. Further, the produced cemented carbide was subjected to edge-formation treatment (R-horning) for the rake face by brushing treatment.

Next, with respect to the above-mentioned cemented carbide, the respective coating layers 3 were formed by CVD method in the coating formation conditions and layer structure as shown in Tables 1 to 4. The surface of each coating layer 3 was subjected to brushing treatment for 30 seconds from the rake face side to produce surface-coated cutting tools of sample Nos. 1 to 29.

TABLE 1

| Coating layer | | Gas mixture composition (% by volume) | Temperature in furnace (° C.) | Pressure (kPa) |
|---|---|---|---|---|
| Undercoat layer (TiN) | | $TiCl_4$: 3.0, $N_2$: 33, $H_2$: Balance | 880 | 16 |
| TiCN1 | | $TiCl_4$: 3.0, $N_2$: 33, $CH_3CN$: 0.4, $H_2$: Balance | 865 | 9 |
| TiCN2 | | $TiCl_4$: 2.7, $N_2$: 23, $CH_3CN$: 0.9, $H_2$: Balance | 865 | 9 |
| TiCN3 | | $TiCl_4$: 3.0, $N_2$: 3, $CH_3CN$: 1.0, $H_2$: Balance | 1000 | 20 |
| TiCN4 | | $TiCl_4$: 3.5, $N_2$: 5, $CH_4$: 8, $H_2$: Balance | 1010 | 30 |
| I | Titanium conversion step 1 | $TiCl_4$: 3.0, $H_2$: Balance | 1010 | 9 |
| II | Titanium conversion step 2 | $TiCl_4$: 1.6, $H_2$: Balance | 1010 | 8 |
| III | Oxidation step 1 | $CO_2$: 2.0, $N_2$: Balance | 1010 | 9 |
| IV | Oxidation step 2 | $CO_2$: 1.7, Ar: Balance | 1010 | 9 |
| V | Oxidation step 3 | CO: 2.0, Ar: Balance | 1010 | 9 |
| VIII | Oxidation step 4 | $CO_2$: 0.6, $N_2$: Balance | 1010 | 9 |
| IX | Oxidation step 5 | $CO_2$: 0.9, $N_2$: Balance | 1010 | 9 |
| VI | Aluminum conversion step 1 | $AlCl_3$: 1.8 $H_2$: Balance | 1010 | 9 |
| VII | Aluminum conversion step 2 | $AlCl_3$: 2.2 $H_2$: Balance | 1010 | 7 |
| TiCNO1 | | $TiCl_4$: 3.0, $CH_4$: 7.0, $N_2$,: 20, $CO_2$: 2.0, $H_2$: Balance | 1010 | 9 |
| TiCNO2 | | $TiCl_4$: 1.5, $CH_4$: 3.4, $N_2$, : 27, $CO_2$: 1.0, $H_2$: Balance | 1010 | 10 |
| TiCNO3 | | $TiCl_4$: 1.5, $CH_4$: 3.0, $N_2$, : 10, CO: 1.5, $H_2$: Balance | 1010 | 10 |
| TiAlCNO | | $TiCl_4$: 1.0, $AlCl_3$: 4.0, $CH_4$: 2.0, $N_2$,: 4.0, CO: 1.5, $H_2$: Balance | 1010 | 10 |
| $Al_2O_3$1 | | $AlCl_3$: 1.5, HCl: 1.0, $CO_2$: 4, $H_2$: Balance | 1005 | 9 |
| $Al_2O_3$2 | | $AlCl_3$: 1.5, HCl: 2, $CO_2$: 4, $H_2S$: 0.3, $H_2$: Balance | 1005 | 9 |
| Surface layer (TiN) | | $TiCl_4$: 3.0, $N_2$: 30, $H_2$: Balance | 1010 | 30 |

TABLE 2

| Coating layer | | Gas mixture composition (% by volume) | Temperature (° C.) | Pressure in furnace (kPa) |
|---|---|---|---|---|
| Undercoat layer (TiN) | | TiCl$_4$: 3.0, N$_2$: 30, H$_2$: Balance | 880 | 16 |
| a | TiCN1 | TiCl$_4$: 3.0, N$_2$: 30, CH$_3$CN: 0.5, H$_2$: Balance | 865 | 9 |
| | TiCN2 | TiCl$_4$: 2.5, N$_2$: 20, CH$_3$CN: 1.0, H$_2$: Balance | 865 | 9 |
| | TiCN3 | TiCl$_4$: 2.5, N$_2$: 4, CH$_3$CN: 1.0, H$_2$: Balance | 1000 | 20 |
| | TiCN4 | TiCl$_4$: 3.0, N$_2$: 7, CH$_4$: 6, H$_2$: Balance | 1010 | 30 |
| b-1 | Titanium source adhesion step(i) | TiCl$_4$: 3.0, H$_2$: Balance | 1010 | 9 |
| | Titanium source adhesion step(ii) | TiCl$_4$: 1.6, H$_2$: Balance | 1010 | 8 |
| | TiCNO1 | TiCl$_4$: 2.8, CH$_4$: 6.0, N$_2$: 20, CO$_2$: 2.0, H$_2$: Balance | 1010 | 9 |
| | TiCNO2 | TiCl$_4$: 1.5, CH$_4$: 3.5, N$_2$: 27, CO$_2$: 0.9, H$_2$: Balance | 1010 | 10 |
| | TiCNO3 | TiCl$_4$: 2.0, CH$_4$: 3.0, N$_2$: 8, CO: 1.5, H$_2$: Balance | 1010 | 10 |
| | TiAlCNO | TiCl$_4$: 1.0, AlCl$_3$: 4.0, CH$_4$: 2.0, N$_2$: 4.0, CO: 1.5, H$_2$: Balance | 1010 | 10 |
| b-2 | Oxidation step(iii) | CO$_2$: 2.0, N$_2$: Balance | 1010 | 9 |
| | Oxidation step(iv) | CO$_2$: 1.7, Ar: Balance | 1010 | 9 |
| | Oxidation step(v) | CO: 2.0, Ar: Balance | 1010 | 9 |
| b-3 | Alminum source adhesion step(vi) | AlCl$_3$: 1.8 H$_2$: Balance | 1010 | 9 |
| | Alminum source adhesion step(vii) | AlCl$_3$: 2.2 H$_2$: Balance | 1010 | 7 |
| c | Al$_2$O$_3$1 | AlCl$_3$: 1.5, HCl: 1.0, CO$_2$: 4, H$_2$: Balance | 1005 | 9 |
| | Al$_2$O$_3$2 | AlCl$_3$: 1.5, HCl: 2, CO$_2$: 4, H$_2$S: 0.3, H$_2$: Balance | 1005 | 9 |
| | Al$_2$O$_3$3* | AlCl$_3$: 1.5, HCl: 2, CO$_2$: 4, H$_2$S: 0.3, H$_2$: Balance | 1050 | 9 |
| Surface layer (TiN) | | TiCl$_4$: 3.0, N$_2$: 30, H$_2$: Balance | 1010 | 30 |

*Al$_2$O$_3$ (transformation) is phase transformed from κ-type to α-type by heating at 1050° C. for 5 hours after coating formation.

The peaks of x-ray diffraction intensity were measured by x-ray diffraction analysis using Cu—Kα ray for each obtained tool to confirm $\theta_t$ and $\theta_{a(hkl)}$, which is the value of 2θ, of the (200) peak of TiCN and peaks of (012), (104), (110), and (113) of the α-type Al$_2$O$_3$ and the $\Delta\theta_{z(hkl)}$ was calculated. The results are shown in Tables 3 and 4. FIGS. 4 and 5 show the peak charts of the x-ray diffraction intensity with a solid line for the sample No. 1 and FIG. 6 shows the peak chart for the sample No. 15.

Further, polishing processing by machine polishing and ion milling was carried out for observing each coating layer 3 having the layered structure shown in Tables 3 and 4 by using the transmission electron microscope (TEM) and a cross section was exposed. The micro structure state of each layer observed in approximately perpendicular direction to the cross section of each layer was observed and the thickness of the layer was measured. The atom types existing in the center of the interlayer were confirmed and the composition was analyzed by energy dispersive spectroscopy (EDS) or electron energy-loss spectroscopy (EELS). With respect to each interlayer shown in Table 4, Ti, Al, C, O, and N were detected; however oxygen content alone was shown in the Table(4). Further, 5 arbitrary ruptured cross sections including the cross section of each coating layer 3 were photographed by a field emission type transmission electron microscope (FE-TEM) and the formation state and the thickness of the interlayer 5 were measured using each photograph and the average of the thickness of the interlayer 5 was calculated. The results are shown in Tables 3 and 4.

Herein, in the case of comparing the positions of $\theta_{a(hkl)}$ and $\theta_{a0(hkl)}$, $\theta_{a(012)}$ and $\theta_{a0(120)}$ were overlapped as shown in FIG. 6 and the actually measured x-ray diffraction charts (solid lines) and the positions (broken lines) of 2θ shown by the JCPDS cards which show the value of 2θ attributed to the respective crystal planes were overlapped to carry out measurement. Based on the data shown in FIG. 5, with respect to the each sample in Table 3, the difference of $\theta_{a(hkl)}$ and Δhkl (difference from the JCPDS data) and the difference of $\theta_{a(116)}$ and $\theta_{a(012)}$ (δ in Table) were calculated. The results are shown in Table 5.

TABLE 3

| | | | | | | Bonding Part | | | | | | | | |
|---|---|---|---|---|---|---|---|---|---|---|---|---|---|---|
| | | | | | | Bonding layer | | | | | | Al$_2$O$_3$ layer (Remark 1) | | |
| | | | MT-TiCN layer | | | | Thick- | | Composing elements [atom %] | | | | | Sur- |
| Sample No. | | Undercoat layer | First layer | Second layer | HT-TiCN layer | Step | ness [nm] | Disconnected | Ti | Al | C | N | O | First layer | Second layer | face layer |
| 1 | | TiN (0.5) | TiCN1 (0.5) | TiCN2 (3.6) | TiCN4 (1.0) | II → III → VI | 10 | None | 25 | 14 | 25 | 14 | 22 | Al$_2$O$_3$1 (0.5) [α] | Al$_2$O$_3$2 (4.0) [α] | TiN (0.5) |
| 2 | | TiN (0.6) | TiCN1 (0.9) | — | — | I → IV → VII | 25 | none | 23 | 18 | 17 | 29 | 13 | Al$_2$O$_3$2 (5.5) [α] | — | TiN (0.4) |
| 3 | | TiN (0.8) | TiCN1 (6.1) | TiCN2 (3.2) | TiCN4 (0.8) | I → III → VII | 8 | None | 26 | 15 | 18 | 16 | 25 | Al$_2$O$_3$1 (0.3) [α] | Al$_2$O$_3$2 (4.2) [α] | TiN (0.7) |
| 4 | | TiN (0.5) | TiCN1 (5.5) | TiCN1 (3.6) | TiCN4 (0.6) | II → III → VI | 20 | None | 30 | 12 | 30 | 8 | 20 | Al$_2$O$_3$1 (1.0) [α] | Al$_2$O$_3$2 (3.6) [α] | TiN (0.8) |

TABLE 3-continued

| | | | | | Bonding Part | | | | | | | | | |
| | | | | | | Bonding layer | | | | | | | | |
| | Under- | MT-TiCN layer | | | | Thick- | | Composing elements [atom %] | | | | | Al₂O₃ layer (Remark 1) | | Sur- |
| Sample No. | coat layer | First layer | Second layer | HT-TiCN layer | Step | ness [nm] | Disconnected | Ti | Al | C | N | O | First layer | Second layer | face layer |
|---|---|---|---|---|---|---|---|---|---|---|---|---|---|---|---|
| 5 | TiN (1.0) | TiCN1 (4.6) | TiCN2 (3.4) | TiCN4 (0.7) | I → III → VII | 15 | none | 31 | 10 | 20 | 23 | 16 | Al₂O₃1 (0.8) [α] | Al₂O₃2 (4.4) [α] | TiN (0.7) |
| 6 | TiN (0.9) | TiCN2 (8.0) | — | TiCN4 (1.0) | I → III → VII | 10 | None | 29 | 9 | 15 | 30 | 17 | Al₂O₃2 (3.9) [α] | — | None |
| 7 | TiN (1.0) | TiCN1 (6.5) | TiCN1 (2.3) | — | II → IV → VII | 16 | None | 23 | 17 | 37 | 10 | 13 | Al₂O₃2 (5.3) [α] | — | None |
| 8 | TiN (0.6) | TiCN1 (5.5) | TiCN2 (3.2) | TiCN4 (0.6) | I → III → VI | 1 to 2 | Disconnected | 32 | 8 | 32 | 7 | 21 | Al₂O₃1 (0.8) [α/k] | Al₂O₃2 (4.7) [α/k] | TiN (0.7) |
| 9 | TiN (0.9) | TiCN1 (8.6) | — | TiCN3 (0.7) | I → V → VI | 12 | None | 38 | 3 | 36 | 21 | 5 | Al₂O₃2 (4.0) [α/k] | — | TiN (0.7) |
| 10 | TiN (0.5) | TiCN1 (7.8) | TiCN2 (2.0) | TiCN4 (0.6) | TiCNO3 | 75 | None | 38 | 3 | 36 | 7 | 16 | Al₂O₃2 (3.9) [α] | — | TiN (0.8) |
| 11 | TiN (0.6) | TiCN1 (6.9) | TiCN2 (3.0) | TiCN4 (1.0) | TiAlCNO | 1350 | None | 13 | 35 | 20 | 18 | 14 | Al₂O₃2 (3.6) [α] | — | TiN (1.0) |
| 12 | TiN (0.8) | TiCN1 (7.6) | TiCN2 (1.6) | TiCN4 (1.0) | TiCNO2 → VI | 80 | None | 32 | 11 | 26 | 14 | 17 | Al₂O₃1 (0.7) [α] | Al₂O₃2 (4.2) [α] | TiN (0.2) |
| 13 | TiN (0.5) | TiCN1 (6.2) | TiCN2 (2.9) | TiCN3 (0.8) | I → TiCNO1 → VII | 65 | None | 29 | 13 | 27 | 12 | 19 | Al₂O₃1 (0.7) [α] | Al₂O₃2 (4.2) [α] | TiN (0.2) |
| 14 | TiN (0.6) | TiCN1 (8.0) | — | TiCN4 (0.8) | — | — | Disconnected | — | — | — | — | — | Al₂O₃ (4.0) [k] | — | TiN (0.4) |

Remark: the numeral in the parenthesis shows layer thickness (μm).
Remark 1: the symbol in the brackets shows the crystal system of Al₂O₃

TABLE 4

| | | | | | | Interlayer | | | content |
| | | TiCN layer | | | | | | | |
| Sample No. | Undercoat layer | First layer | Second layer | Third layer | Δθ$_t$ (°) | Treatment step | Thickness (nm) | Disconnected | (% by atom) |
|---|---|---|---|---|---|---|---|---|---|
| 15 | TiN (1.0) | TiCN1 (8.8) | — | — | 0.02 | (ii) → (iv) → (vii) | 6 | None | 22 |
| 16 | TiN (1.0) | TiCN1 (4.6) | TiCN2 (3.4) | TiCN4 (0.7) | 0.02 | (i) → (iii) → (vii) | 22 | None | 13 |
| 17 | TiN (0.6) | TiCN1 (9.0) | — | — | 0.03 | (i) → (iv) → (vii) | 8 | None | 25 |
| 18 | TiN (0.5) | TiCN1 (5.0) | TiCN2 (3.6) | TiCN4 (1.0) | 0.01 | (ii) → (iii) → (vi) | 17 | None | 20 |
| 19 | TiN (0.5) | TiCN1 (9.1) | TiCN4 (0.6) | — | 0.01 | (ii) → (iii) → (vi) | 15 | None | 16 |
| 20 | TiN (0.9) | TiCN2 (8.0) | TiCN4 (1.0) | — | 0.01 | (ii) → (iii) → (vii) | 10 | None | 17 |
| 21 | TiN (0.8) | TiCN1 (6.1) | TiCN2 (3.2) | TiCN4 (0.8) | 0.04 | (i) → (iii) → (vii) | 9 | None | 13 |
| 22 | TiN (0.5) | TiCN1 (7.8) | TiCN2 (2.0) | TiCN4 (0.6) | 0.02 | TiCNO3 → (iii) | 28 | None | 10 |
| 23 | TiN (0.5) | TiCN1 (7.8) | TiCN2 (2.0) | TiCN4 (0.6) | 0.01 | TiCNO3 → (iv) → (vii) | 26 | None | 15 |
| 24 | TiN (0.9) | TiCN1 (8.6) | TiCN3 (0.7) | — | 0.03 | (i) > (v) > (vi) | 8 | Disconnected | 5 |
| 25 | TiN (0.5) | TiCN1 (6.2) | TiCN2 (2.9) | TiCN3 (0.8) | 0.02 | (i) → TiCNO1 → (vii) | 59 | Disconnected | 16 |
| 26 | TiN (0.6) | TiCN1 (6.9) | TiCN2 (3.0) | TiCN4 (1.0) | 0.02 | TiAlCNO | 100 | None | 14 |
| 27 | TiN (0.8) | TiCN1 (7.6) | TiCN2 (1.6) | TiCN4 (1.0) | 0.04 | TiCNO2 → (vi) | 50 | None | 17 |
| 28 | TiN (0.8) | TiCN1 (7.0) | TiCN4 (0.6) | — | 0.02 | TiCNO1 | 20 | Disconnected | 19 |
| 29 | TiN (0.6) | TiCN1 (5.5) | TiCN2 (3.2) | TiCN4 (0.6) | 0.04 | (i) → (iii) → (vi) | | Disconnected | — |

TABLE 4-continued

| Sample No. | Al$_2$O$_3$ layer (Remark 1) First layer | Second layer | $\theta_{z(102)}$ | $\theta_{z(104)}$ | $\theta_{z(110)}$ | $\theta_{z(113)}$ | Surface layer |
|---|---|---|---|---|---|---|---|
| 15 | Al$_2$O$_3$2 (5.3) [α] | — | +0.03 | +0.04 | +0.04 | +0.05 | None |
| 16 | Al$_2$O$_3$1 (0.8) [α] | Al$_2$O$_3$2 (4.4) [α] | +0.17 | +0.15 | +0.16 | +0.17 | TiN (0.7) |
| 17 | Al$_2$O$_3$2 (5.5) [α] | — | −0.14 | −0.10 | −0.10 | −0.16 | TiN (0.4) |
| 18 | Al$_2$O$_3$1 (0.5) [α] | Al$_2$O$_3$2 (4.0) [α] | −0.04 | +0.01 | 0 | −0.02 | TiN (0.5) |
| 19 | Al$_2$O$_3$1 (1.0) [α] | Al$_2$O$_3$2 (3.6) [α] | −0.01 | +0.05 | +0.07 | +0.05 | TiN (0.8) |
| 20 | Al$_2$O$_3$2 (3.9) [α] | — | −0.06 | −0.03 | −0.05 | −0.02 | TiN |
| 21 | Al$_2$O$_3$1 (0.3) [α] | Al$_2$O$_3$2 (4.2) [α] | −0.06 | −0.03 | −0.05 | −0.02 | TiN (0.7) |
| 22 | Al$_2$O$_3$2 (3.9) [α] | — | −0.17 | −0.18 | −0.12 | −0.11 | TiN (0.8) |
| 23 | Al$_2$O$_3$1 (0.3) [α] | Al$_2$O$_3$2 (3.7) [α] | −0.05 | −0.01 | −0.03 | 0 | TiN (0.5) |
| 24 | Al$_2$O$_3$2 (4.0) [α] | — | — | — | — | — | TiN (0.7) |
| 25 | Al$_2$O$_3$1 (0.7) [α] | Al$_2$O$_3$2 (4.2) [α] | −0.50 | −0.49 | −0.48 | −0.48 | TiN (0.2) |
| 26 | Al$_2$O$_3$2 (3.6) [α] | — | −0.45 | −0.44 | −0.44 | −0.42 | TiN (1.0) |
| 27 | Al$_2$O$_3$1 (0.7) [α] | Al$_2$O$_3$2 (4.2) [α] | −0.30 | −0.32 | −0.34 | −0.31 | TiN (0.2) |
| 28 | Al$_2$O$_3$3 (4.0) [α] | — | +0.46 | +0.39 | +0.44 | +0.40 | TiN (0.4) |
| 29 | Al$_2$O$_3$1 (0.8) [α] | Al$_2$O$_3$2 (4.7) [α] | — | — | — | — | TiN (0.7) |

Remark: the numeral in the parenthesis show thickness (μm).
Remark 1: the symbol in the brackets shows the crystal system of Al$_2$O$_3$

| Sample No. | $\theta_{a(hkl)}$ and $\theta_{a0(hkl)}$ of Al$_2$O$_3$ layer Upper step: $\theta_{a(hkl)}$ ((102) plane standard) Lower step: Δhkl (difference from $\theta_{a0(hkl)}$ (JCPDS data)) | | | | | δ |
|---|---|---|---|---|---|---|
| | (104) 35.13 (JCPDS) | (110) 37.78 (JCPDS) | (113) 43.36 (JCPDS) | (024) 52.55 (JCPDS) | (116) 57.52 (JCPDS) | |
| 15 | 35.16 −0.03 | 37.78 0 | 43.36 0 | 52.53 0.02 | 57.48 0.04 | 31.90 |
| 16 | 35.17 −0.04 | 37.78 0 | 43.36 0 | 52.58 −0.03 | 57.37 0.15 | 31.79 |
| 17 | 35.2 −0.07 | 37.8 −0.02 | 43.38 −0.02 | 52.6 −0.05 | 57.51 0.01 | 31.93 |
| 18 | 35.18 −0.05 | 37.78 0 | 43.36 0 | 52.6 −0.05 | 57.4 0.12 | 31.82 |
| 19 | 35.15 −0.02 | 37.82 −0.04 | 43.38 −0.02 | 52.58 −0.03 | 57.4 0.12 | 31.82 |
| 20 | 35.14 −0.01 | 37.8 −0.02 | 43.4 −0.04 | 52.56 −0.01 | 57.44 0.08 | 31.86 |
| 21 | 35.18 −0.05 | 37.78 0 | 43.4 −0.04 | 52.56 −0.01 | 57.44 0.08 | 31.86 |
| 22 | 35.12 0.01 | 37.82 0 | 43.36 −0.04 | 52.56 0.02 | 57.4 0.02 | 31.92 |
| 23 | 35.16 −0.03 | 37.82 −0.04 | 43.36 0 | 52.56 −0.01 | 57.4 0.12 | 31.82 |
| 24 | — | — | — | — | — | — |
| 25 | 35.16 −0.03 | 37.76 0.02 | 43.34 0.02 | 52.56 −0.01 | 57.55 −0.03 | 31.97 |
| 26 | 35.15 −0.02 | 37.78 0 | 43.4 −0.04 | 52.55 0 | 57.54 −0.02 | 31.96 |
| 27 | 35.18 −0.05 | 37.74 0.04 | 43.4 −0.04 | 52.57 −0.02 | 57.56 −0.04 | 31.98 |
| 28 | 35.16 −0.03 | 37.74 0.04 | 34 9.36 | 52.53 0.02 | 57.6 −0.08 | 32.02 |
| 29 | — | — | — | — | — | — |

An intermittent cutting test was carried out in the following condition by using each cutting tool to evaluate the fracture resistance.

(Intermittent Cutting Condition)

Work material: Sleeve materials of ductile cast iron (FCD 700) with 8 grooves

Cutting tool: CNMA120412

Cutting speed: 250 m/min

Feeding rate: 0.45 mm/rev

Cutting depth: 1.5 mm

Others: Using an aqueous cutting fluid

Evaluation item: the number of impacts at the time of occurrence of cracking

At the moment of 1000th, 2000th, and 3000th of the impact times during cutting, the coating layer of each cutting edge was observed with a microscope to determine whether or not the coating layer is peeled.

The results are shown in Tables 6 and 7

TABLE 6

| Sample No. | State of a hard coating layer during the test | | | Number of impacts at the time of cracking (times) |
|---|---|---|---|---|
| | At the 1000th impact | At the 2000th impact | At the 3000th impact | |
| 1 | No peeling | No peeling | No peeling | 3800 |
| 2 | No peeling | Slight Al2O3 peeling | Partial Al2O3 peeling | 3650 |
| 3 | No peeling | No peeling | Partial Al2O3 peeling | 3760 |
| 4 | No peeling | No peeling | No peeling | 3840 |
| 5 | No peeling | No peeling | Partial Al2O3 peeling | 3710 |
| 6 | No peeling | No peeling | No peeling | 3740 |
| 7 | No peeling | Slight Al2O3 peeling | Partial Al2O3 peeling | 3620 |
| 8 | No peeling | Al2O3 peeling and partial mother material exposure | — | 2640 |
| 9 | Partial Al2O3 peeling | Al2O3 peeling and mother material exposure | — | 2410 |
| 10 | Partial Al2O3 layer peeling | Al2O3 peeling and mother material exposure | — | 2560 |
| 11 | Partial Al2O3 layer peeling | Al2O3 peeling and mother material exposure | — | 2475 |
| 12 | No peeling | Al2O3 peeling and partial mother material exposure | — | 2610 |
| 13 | No peeling | Al2O3 peeling and partial mother material exposure | — | 2460 |
| 14 | Partial Al2O3 layer peeling | Al2O3 peeling and mother material exposure | — | 1900 |

TABLE 7

| Sample No. | State of a hard coating layer during the test | | | Number of impacts at the time of cracking (times) |
|---|---|---|---|---|
| | At the 1000th impact | At the 2000th impact | At the 3000th impact | |
| 15 | No peeling | Slight Al2O3 peeling | Partial Al2O3 peeling | 3680 |
| 16 | No peeling | No peeling | Partial Al2O3 peeling | 3600 |
| 17 | No peeling | Slight Al2O3 peeling | Partial Al2O3 peeling | 3600 |
| 18 | No peeling | No peeling | No peeling | 3900 |
| 19 | No peeling | No peeling | No peeling | 3700 |
| 20 | No peeling | No peeling | No peeling | 3850 |
| 21 | No peeling | No peeling | Partial Al2O3 peeling | 3750 |
| 22 | No peeling | No peeling | Partial Al2O3 peeling | 3500 |
| 23 | No peeling | No peeling | No peeling | 3750 |
| 24 | Partial Al2O3 peeling | Al2O3 peeling and mother material exposure | — | 2340 |
| 25 | No peeling | Al2O3 peeling and partial mother material exposure | — | 2550 |
| 26 | Partial Al2O3 peeling | Al2O3 peeling and mother material exposure | — | 2450 |
| 27 | No peeling | Al2O3 peeling and partial mother material exposure | — | 2360 |
| 28 | Partial Al2O3 peeling | — | — | 1850 |
| 29 | No peeling | Al2O3 peeling and partial mother material exposure | — | 2450 |

From Tables 1 to 7, the $Al_2O_3$ layer separation occurred from 1000th to 2000th impact for sample Nos. 10 to 14 and sample Nos. 24 to 29 and the damages reached to the substrate and thus the samples were inferior in the fracture resistance.

On the other hand, in the sample Nos. 1 to 9 and sample Nos. 15 to 23 within the scope of the present invention and having the value of $\Delta\theta_{z(hkl)}$ in a range of −0.2 to 0.2, the peeling of the $Al_2O_3$ layer was suppressed in the cutting evaluation and thus the samples were found having excellent fracture resistance and cutting capability.

EXAMPLE 2

The respective types of coating layers with the layer structures were formed for the cemented carbides subjected to the edge treatment (R-honing) of Example 1 in the coating formation condition by the CVD method as shown in Table 1 and Table 7. The obtained samples (30 to 33) were evaluated in the same manner as Example 1. The results are shown in Table 8 to 10.

TABLE 8

| Sample No. | Undercoat layer | MT-TiCN layer | | HT-TiCN layer | Bonding Part | | | | | | | |
|---|---|---|---|---|---|---|---|---|---|---|---|---|
| | | First Layer | Second layer | | Bonding layer | | | Constituent elements [atom %] | | | | |
| | | | | | Step | Thickness [nm] | Disconnection | Ti | Al | C | N | O |
| 30 | TiN (0.3) | TiCN1 (5.4) | TiCN2 (3.3) | TiCN4 (0.6) | VIII → VI | 0.6 | None | 25 | 14 | 15 | 11 | 35 |
| 31 | TiN (0.6) | TiCN1 (5.3) | TiCN1 (3.2) | TiCN4 (0.6) | VIII → VII | 0.9 | None | 30 | 12 | 18 | 15 | 25 |
| 32 | TiN (0.8) | TiCN2 (8.6) | — | TiCN4 (0.7) | IX → VII | 1.6 | None | 29 | 17 | 13 | 1 | 40 |

TABLE 8-continued

| | | | | | | | Bonding Part | | | | | |
| --- | --- | --- | --- | --- | --- | --- | --- | --- | --- | --- | --- | --- |
| | | | | | | | Bonding layer | | | | | |
| | | MT- TiCN layer | | | | | | Constituent | | | | |
| Sample | Undercoat | First | Second | HT-TiCN | Thickness | | | elements [atom %] | | | | |
| No. | layer | Layer | layer | layer | Step | [nm] | Disconnection | Ti | Al | C | N | O |
| 33 | TiN (1.0) | TiCN1 (7.0) | TiCN1 (2.0) | — | IX → VI | 2.5 | None | 23 | 10 | 20 | 16 | 31 |

Remark: the numeral in the parenthesis shows thickness (μm)

TABLE 9

| | AlO₃ layer [Remark 1] | | | | | | |
| --- | --- | --- | --- | --- | --- | --- | --- |
| Sample No. | First layer | Second layer | $\theta_z$ (012) | $\theta_z$ (104) | $\theta_z$ (110) | $\theta_z$ (113) | Surface layer |
| 30 | Al₂O₃1 (0.5) [a] | Al₂O₃2 (4.0) [a] | +0.04 | +0.03 | +0.05 | +0.06 | TiN (0.5) |
| 31 | Al₂O₃1 (1.0) [a] | Al₂O₃2 (3.60) [a] | −0.02 | +0.02 | +0.04 | +0.03 | TiN (0.8) |
| 32 | Al₂O₃2 (3.9) [a] | — | +0.09 | +0.12 | +0.13 | +0.12 | None |
| 33 | Al₂O₃2 (5.3) [a] | — | +0.02 | +0.06 | −0.01 | +0.04 | None |

Remark: the numeral in the parenthesis shows thickness (μm).
Remark 1: the symbol in the brackets shows the crystal system of Al₂O₃

TABLE 10

| | State of a hard coating layer during the test | | | Number of impacts |
| --- | --- | --- | --- | --- |
| Sample No. | At the 1000th impact | At the 2000th impact | At the 3000th impact | at the time of cracking (times) |
| 30 | No peeling | No peeling | Partial Al2O3 peeling | 3780 |
| 31 | No peeling | Slight Al2O3 peeling | Partial Al2O3 peeling | 3760 |
| 32 | No peeling | Slight Al2O3 peeling | Partial Al2O3 peeling | 3700 |
| 33 | No peeling | Slight Al2O3 peeling | Partial Al2O3 peeling | 3670 |

From Tables 1, 8 to 10, in all of the sample Nos. 30 to 33, the peeling of the Al₂O₃ layer was suppressed in the cutting evaluation and the samples were found having excellent fracture resistance and cutting capability.

EXPLANATION OF SYMBOLS

Figure 1:
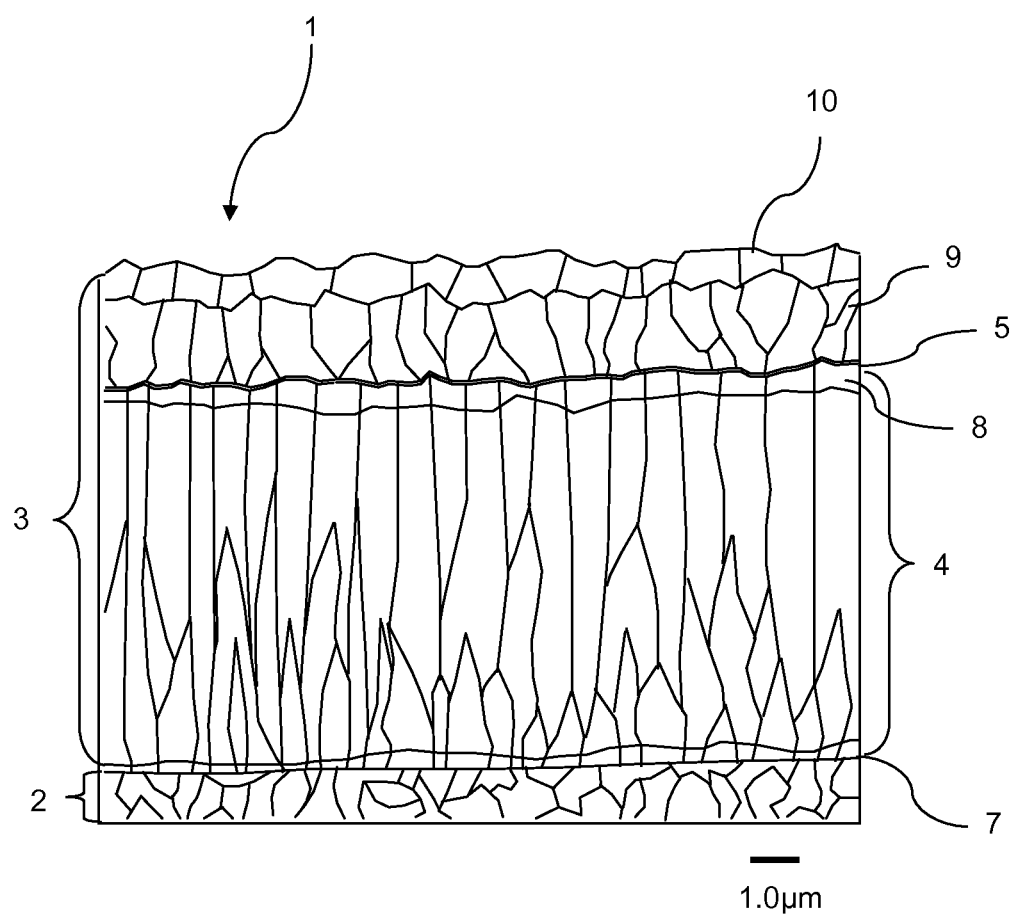
FIG. 1 shows an image of a main part of a surface-coated member 1 of one embodiment of the present invention by a scanning electron microscopic (SEM) photograph.
Figure 2A:
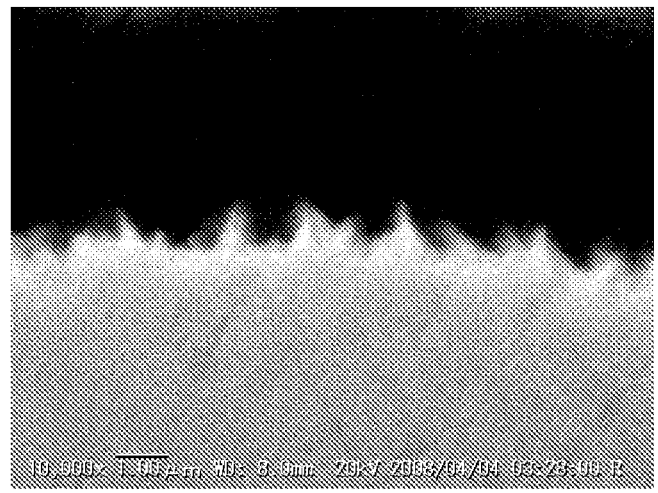
FIG. 2 shows a scanning electron microscope (SEM) photographs of the peripheries of the interlayers of cross sections of coating layers 3 of the surface-coated member 1 of one embodiment of the present invention.
Figure 2B:
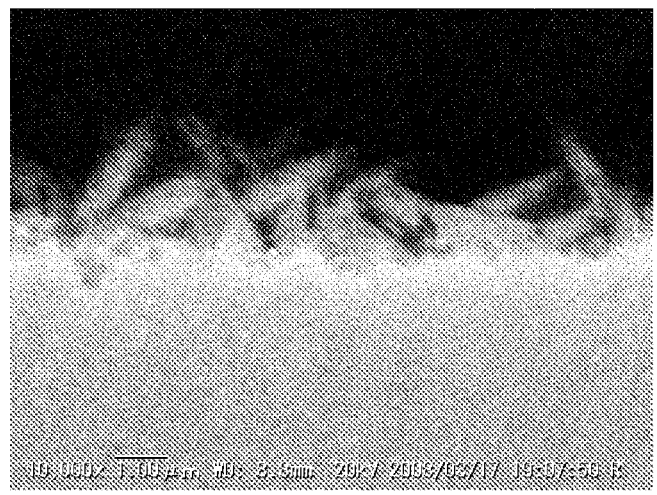
Figure 3:
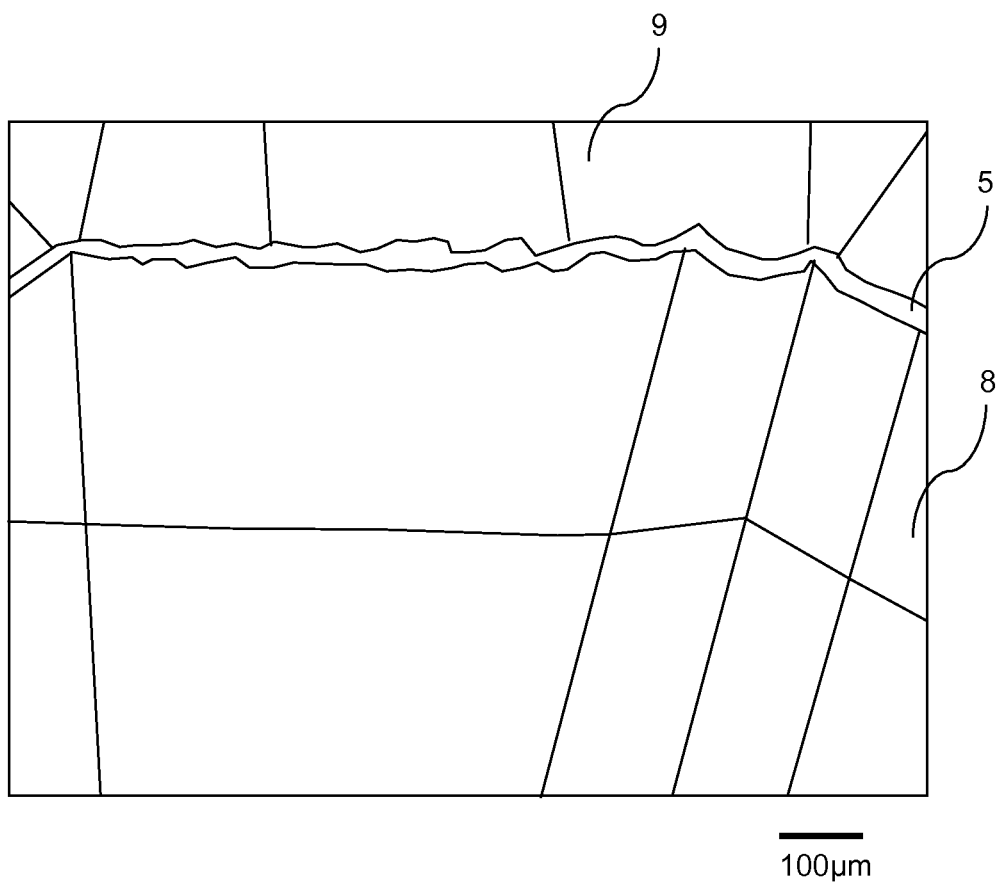
FIG. 3 shows an image of a main part of the coating layer 3 of one embodiment of the present invention by a field emission-transmission electron microscopic (FE-TEM) photograph.
Figure 4:
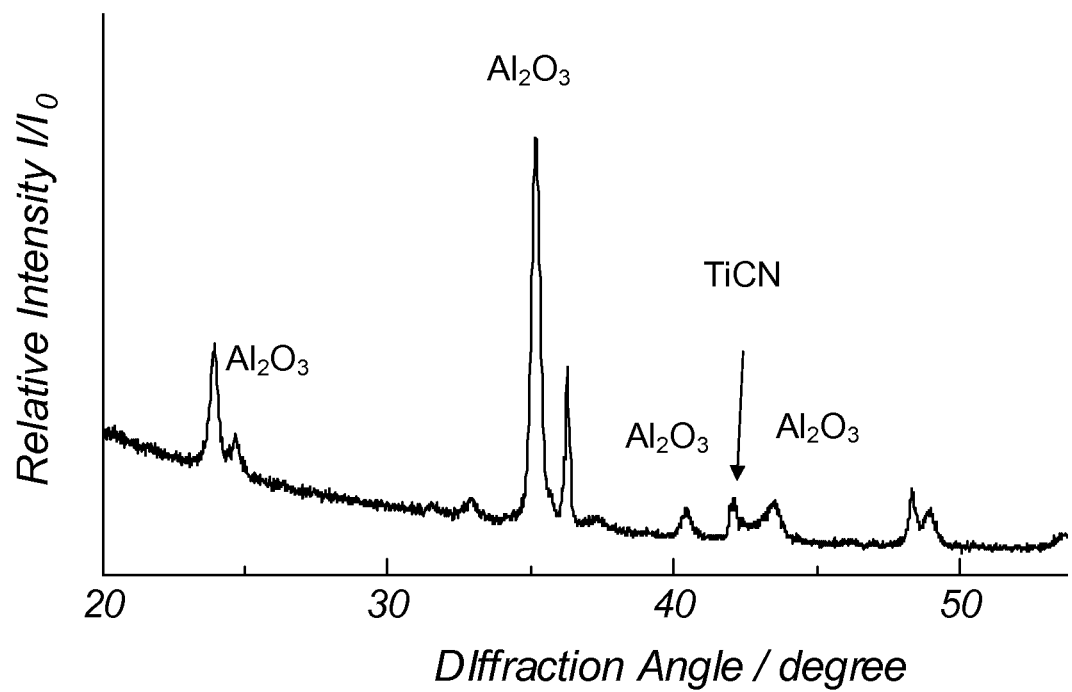
FIG. 4 shows a peak chart of x-ray diffraction intensity obtained for the surface-coated cutting tool of one embodiment of the present invention.
Figure 5A:
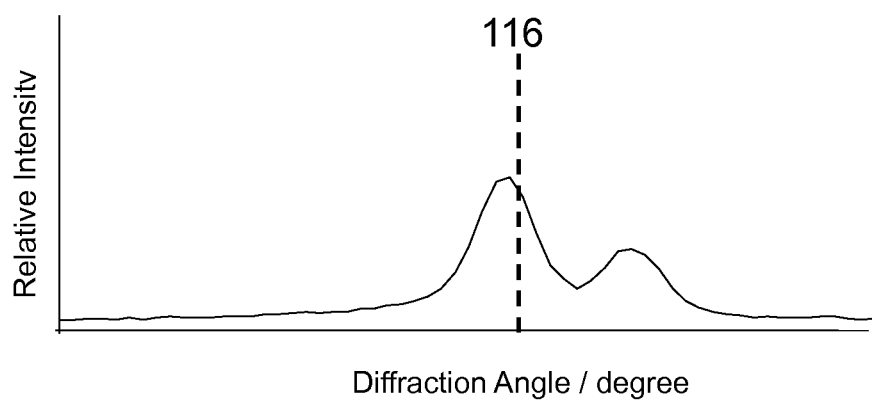
FIGS. 5A and 5B show partially magnified drawings of FIG. 2.
Figure 5B:
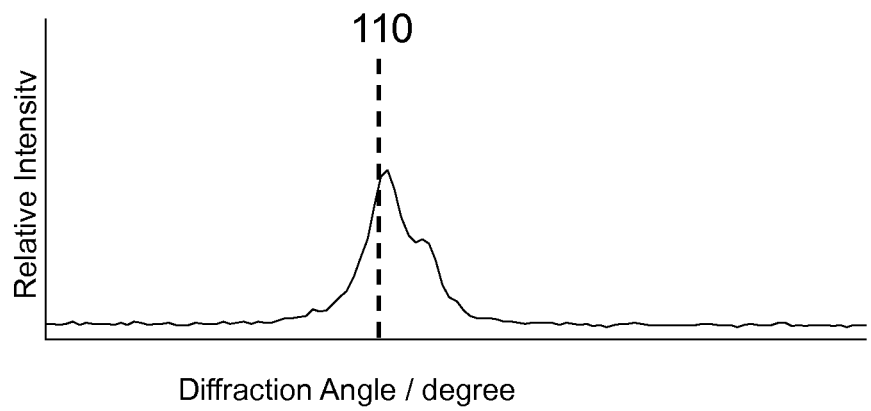
Figure 6:
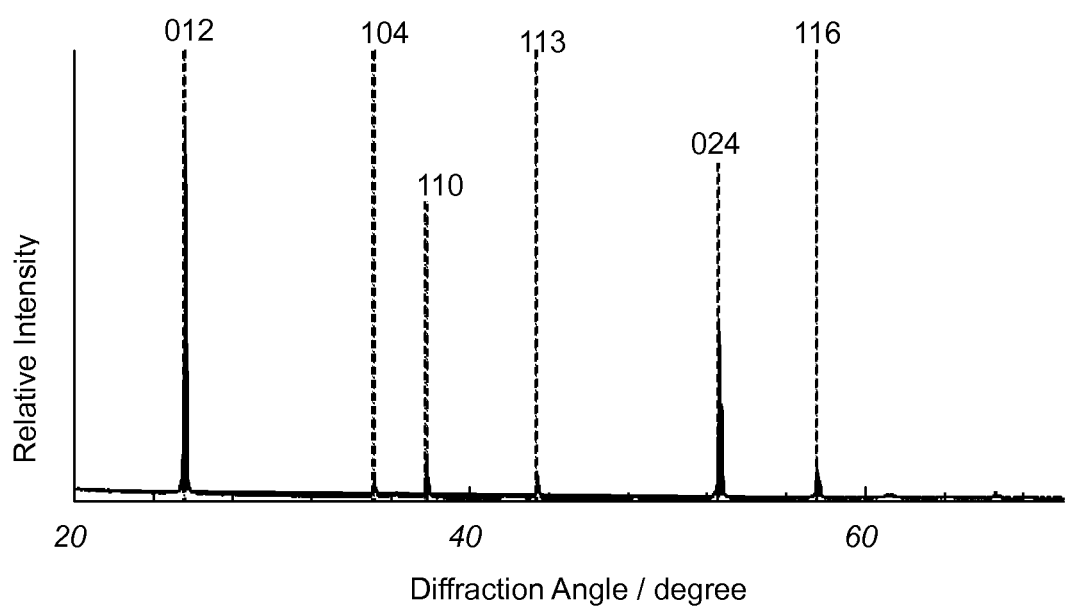
FIG. 6 shows a peak chart of x-ray diffraction intensity obtained for the surface-coated cutting tool of another embodiment of the present invention.

| | |
| --- | --- |
| 1. | Surface-coated member |
| 2. | Substrate |
| 3. | Coating layer |
| 4. | Titanium carbonitride layer |
| 5. | Interlayer |
| 7. | Undercoat layer |
| 9. | α-type Al₂O₃ layer |
| 10. | Surface layer |

The invention claimed is:

1. A surface-coated member, comprising:
a substrate; and
a plurality of coating layers on the substrate comprising:
    a titanium carbonitride layer;
    an interlayer on the titanium carbonitride layer:
        containing titanium, aluminum, carbon and oxygen;
        having an average thickness of 0.5 to 30 nm; and
        having no disconnection in a cross-sectional view; and
    an aluminum oxide layer on the interlayer comprising an α-type aluminum oxide crystals.

2. The surface-coated member according to claim 1, wherein the oxygen content in the center of the interlayer in the thickness direction is 15 to 40% by atom.

3. The surface-coated member according to claim 1, wherein with respect to the diffraction peaks of x-ray diffraction analysis for the surface-coated member, in the case where $\theta_t$ is defined as the 2θ value of a diffraction peak attributed to the (200) plane of TiCN; $\theta_{t0}$ is defined as the 2θ value of a diffraction peak attributed to the (200) plane of TiCN described in JCPDS card; $\theta_{a(hkl)}$ is defined as the 2θ value of a diffraction peak attributed to the (012), (104), (110), and (113) planes of the α-type crystal structure of Al₂O₃ (wherein, (hkl) is one of (012), (104), (110), and (113)); and $\theta_{a0(hkl)}$ is defined as the 2θ value of a diffraction peak attributed to the (012), (104), (110), and (113) planes of the α-type crystal structure of Al₂O₃ described in JCPDS card (wherein, (hkl) is one of (012), (104), (110), and (113)); the difference of $\Delta\theta_{z(hkl)}(=\theta_t-\theta_{a(hkl)}$ (wherein (hkl) is one of (012), (104), (110), and (113)) between the difference $\Delta\theta_t(=\theta_t-\theta_{t0})$ of $\theta_t$ and $\theta_{t0}$ and the difference of $\Delta\theta_{a(hkl)}(=\theta_{a(hkl)}-\theta_{a0(hkl)})$ of $\theta_{a(hkl)}$ and $\theta_{a0(hkl)}$ of (012), (104), (110), and (113) planes is all in a range of −0.2° to 0.2°.

4. The surface-coated member according to claim 3, wherein $\Delta\theta_{z(012)}$ for the (012) plane is in a range of −0.2° to 0°.

5. The surface-coated member according to claim 1, wherein if the difference of the $\theta_{a(012)}$ and the $\theta_{a0(012)}$ is corrected to be zero, $\theta_{a(116)}$ appears at a lower angle than $\theta_{a0(116)}$.

6. The surface-coated member according to claim 5, wherein $\theta_{a(116)}$ appears in the higher angle side by 31.8° to 31.9° than $\theta_{a(012)}$.

7. The surface-coated member according to claim 5, wherein $\theta_{a(104)}$, $\theta_{a(110)}$, $\theta_{a(113)}$, and $\theta_{a(024)}$ appear in the higher angle side than the $\theta_{a0(104)}$, $\theta_{a0(110)}$, $\theta_{a0(113)}$, and $\theta_{a0(024)}$, respectively.

8. The surface-coated member according to claim 5, wherein the α-type aluminum oxide layer is made of columnar crystals extended along the thickness direction.

9. A cutting tool provided with the surface-coated member according to claim 1.

10. The surface-coated member according to claim 1, wherein
the interlayer is located on the titanium carbonitride layer, and
the aluminum oxide layer is on the interlayer.

11. The surface-coated member according to claim 1, wherein the aluminum oxide layer consists essentially of α-type aluminum oxide crystals.

12. The surface-coated member according to claim 1, wherein:
the titanium carbonitride layer consists essentially of a chemical composition of TiCN, and
the aluminum oxide layer consists essentially of a chemical composition of $Al_2O_3$.

* * * * *